(12) United States Patent
Hayashida et al.

(10) Patent No.: US 10,692,794 B2
(45) Date of Patent: Jun. 23, 2020

(54) RADIATION PLATE STRUCTURE, SEMICONDUCTOR DEVICE, AND METHOD FOR MANUFACTURING RADIATION PLATE STRUCTURE

(71) Applicant: Mitsubishi Electric Corporation, Tokyo (JP)

(72) Inventors: Yukimasa Hayashida, Tokyo (JP); Hiroki Shiota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/768,601

(22) PCT Filed: Jan. 14, 2016

(86) PCT No.: PCT/JP2016/050914
§ 371 (c)(1),
(2) Date: Apr. 16, 2018

(87) PCT Pub. No.: WO2017/122306
PCT Pub. Date: Jul. 20, 2017

(65) Prior Publication Data
US 2018/0294203 A1    Oct. 11, 2018

(51) Int. Cl.
*H01L 23/36*   (2006.01)
*H01L 23/373*  (2006.01)
(Continued)

(52) U.S. Cl.
CPC .......... *H01L 23/36* (2013.01); *H01L 23/3735* (2013.01); *H05K 1/02* (2013.01);
(Continued)

(58) Field of Classification Search
None
See application file for complete search history.

(56) References Cited

U.S. PATENT DOCUMENTS 4,604,643 A * 8/1986 Yotsumoto .............. H01L 23/36
                                                257/732
5,702,820 A   12/1997 Yokoshima et al.
(Continued)

FOREIGN PATENT DOCUMENTS

JP    S61-168232 A    7/1986
JP    S61-270893 A    12/1986
(Continued)

OTHER PUBLICATIONS

International Search Report issued in PCT/JP2016/050914; dated Apr. 5, 2016.
(Continued)

*Primary Examiner* — Lex H Malsawma
(74) *Attorney, Agent, or Firm* — Studebaker & Brackett PC

(57) ABSTRACT

A radiation plate structure includes a radiation plate, and a solder resist disposed on a main surface of the radiation plate and having at least one opening. The solder resist is made of any of polyimide (PI), polyamide (PA), polypropylene (PP), polyphenylene sulfide (PPS), a resin containing particulate ceramic (e.g., aluminum nitride (AlN), silicon nitride ($Si_3N_4$), or aluminum oxide ($Al_2O_3$)), and a high-melting-point insulator made of, for instance, glass.

7 Claims, 4 Drawing Sheets

(51) Int. Cl.
  *H05K 1/02* (2006.01)
  *H05K 1/03* (2006.01)
  *H01L 23/367* (2006.01)

(52) U.S. Cl.
  CPC .. *H01L 23/367* (2013.01); *H01L 2224/32225* (2013.01); *H01L 2224/47* (2013.01); *H01L 2224/83801* (2013.01); *H01L 2924/0665* (2013.01); *H05K 1/0306* (2013.01); *H05K 2201/0154* (2013.01); *H05K 2201/066* (2013.01)

(56) References Cited

U.S. PATENT DOCUMENTS

| | | | |
|---|---|---|---|
| 5,895,973 A * | 4/1999 | Fessenden | H01L 24/28 257/675 |
| 2002/0104877 A1 | 8/2002 | Morimoto et al. | |
| 2002/0114133 A1* | 8/2002 | Ho | H01L 23/36 361/704 |
| 2004/0238947 A1* | 12/2004 | Rumer | H01L 23/40 257/707 |
| 2007/0152322 A1* | 7/2007 | Inomata | H01L 23/367 257/706 |
| 2008/0206928 A1 | 8/2008 | Onishi et al. | |
| 2011/0042806 A1* | 2/2011 | Koide | H01L 25/0655 257/737 |
| 2011/0163438 A1* | 7/2011 | Takahashi | H01L 21/561 257/698 |
| 2012/0250281 A1 | 10/2012 | Kawai et al. | |
| 2013/0313697 A1* | 11/2013 | Sato | H01L 23/3677 257/690 |
| 2015/0055302 A1* | 2/2015 | Nagatomo | H01L 23/3735 361/709 |
| 2018/0077789 A1* | 3/2018 | Yamazaki | H05K 1/0203 |

FOREIGN PATENT DOCUMENTS

| | | |
|---|---|---|
| JP | H02-294371 A | 12/1990 |
| JP | H06167806 A | 6/1994 |
| JP | H07-207211 A | 8/1995 |
| JP | H10-256443 A | 9/1998 |
| JP | H11223946 A | 8/1999 |
| JP | 2001-358452 A | 12/2001 |
| JP | 2006049777 A | 2/2006 |
| JP | 2006-278558 A | 10/2006 |
| JP | 2008-060270 A | 3/2008 |
| JP | 2008-205100 A | 9/2008 |
| JP | 2008-207207 A | 9/2008 |
| JP | 2013-118364 A | 6/2013 |
| JP | 2015170797 A | 9/2015 |

OTHER PUBLICATIONS

International Preliminary Report on Patentability issued in corresponding International Application No. PCT/JP2016/050914; dated Jul. 26, 2018.

An Office Action; "Notification of Reasons for Refusal," issued by the Japanese Patent Office on Jan. 22, 2019, Which corresponds to Japanese Patent Application No. 2017-561450 and is related to U.S. Appl. No. 15/768,601 with English Translation.

An Office Action mailed by the Japanese Patent Office dated Sep. 3, 2019, which corresponds to Japanese Patent Application No. 2017-561450 and is related to U.S. Appl. No. 15/768,601.

An Office Action mailed by the German Patent and Trade Mark Office dated Apr. 20, 2020, which corresponds to German Patent Application No. DE 11 2016 006 225.7.

* cited by examiner

F I G. 5
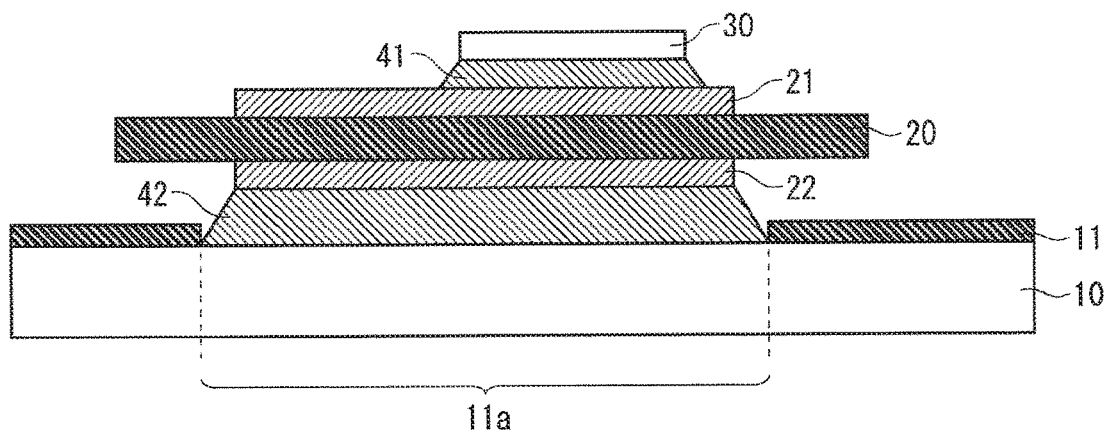
F I G. 6
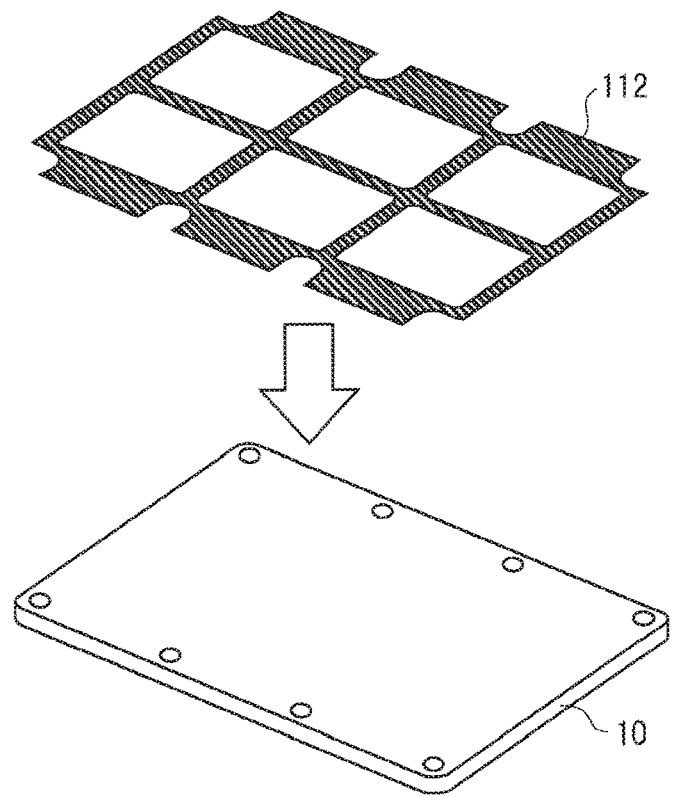

US 10,692,794 B2

RADIATION PLATE STRUCTURE, SEMICONDUCTOR DEVICE, AND METHOD FOR MANUFACTURING RADIATION PLATE STRUCTURE

TECHNICAL FIELD

The present invention relates to radiation plates for semiconductor devices and semiconductor devices including the same.

BACKGROUND ART

A typical semiconductor device is structured such that an insulating substrate on which a semiconductor element is mounted is disposed on a radiation plate (e.g., Patent Documents 1 and 2). Further, when the radiation plate is soldered to the insulating substrate, a pattern of a solder resist can be previously formed on a surface of the radiation plate so that solder melted in a reflowing step is held in a prescribed position. Typical examples of a material of the solder resist include a phenolic resin and an epoxy resin.

PRIOR ART DOCUMENTS

Patent Documents

Patent Document 1: Japanese Patent Application Laid-Open No. 2006-278558
Patent Document 2: Japanese Patent Application Laid-Open No. 2008-205100

SUMMARY

Problem to be Solved by the Invention

In order for the semiconductor device to have a high breakdown voltage, the solder resist on the radiation plate desirably has high insulation properties. Hence, the solder resist needs to have a large thickness. A conventional solder resist made of a phenolic resin or an epoxy resin has a maximum thickness ranging from about 5 to 10 μm.

Further, in order for the semiconductor device to be reliable in a high temperature environment, solder having a high melting point tends to be used in manufacture of the semiconductor device. This tendency involves a high temperature in the reflowing step in the manufacture of the semiconductor device, and a higher temperature in a reliability test. Thus, the solder resist is required to have a high thermal resistance. An insufficient thermal resistance of the solder resist causes the solder resist to be removed from the radiation plate. As a result, melted solder is no longer held in the prescribed position, thereby causing the insulating substrate to be shifted with respect to the radiation plate. This makes the semiconductor device difficult to be assembled. Moreover, the removal of the solder resist from the radiation plate causes a reduction in breakdown voltage of the semiconductor device.

The present invention has been made to solve the aforementioned problem. It is an object of the present invention to improve insulation properties and thermal resistance of a solder resist in a radiation plate structure including the solder resist on a radiation plate, thereby achieving a more reliable semiconductor device.

Means to Solve the Problem

A radiation plate structure according to a first aspect of the present invention includes a radiation plate and a solder resist disposed on a main surface of the radiation plate and having at least one opening. The solder resist is made of any of polyimide (PI), polyimide (PA), polypropylene (PP), and polyphenylene sulfide (PPS).

A radiation plate structure according to a second aspect of the present invention includes a radiation plate and a solder resist disposed on a main surface of the radiation plate and having at least one opening. The solder resist is made of a resin containing particulate ceramic.

A radiation plate structure according to a third aspect of the present invention includes a radiation plate and a solder resist disposed on a main surface of the radiation plate and having at least one opening. The solder resist is formed of a high-melting-point insulator having a inciting point of 400 degrees or more.

Effects of the Invention

By virtue of the aspects of the present invention, the solder resist on the radiation plate of a semiconductor device has high insulation properties and a high thermal resistance. This contributes to an improvement in reliability of the semiconductor device.

These and other objects, features, aspects and advantages of the present invention will become more apparent from the following detailed description of the present invention when taken in conjunction with the accompanying drawings.

BRIEF DESCRIPTION OF DRAWINGS

FIG. 5 is a cross-sectional view of the semiconductor device according to the first embodiment.
FIG. 6 is a diagram illustrating a method for manufacturing a radiation plate structure according to a second embodiment

DESCRIPTION OF EMBODIMENT(S)

First Embodiment

Figure 1:
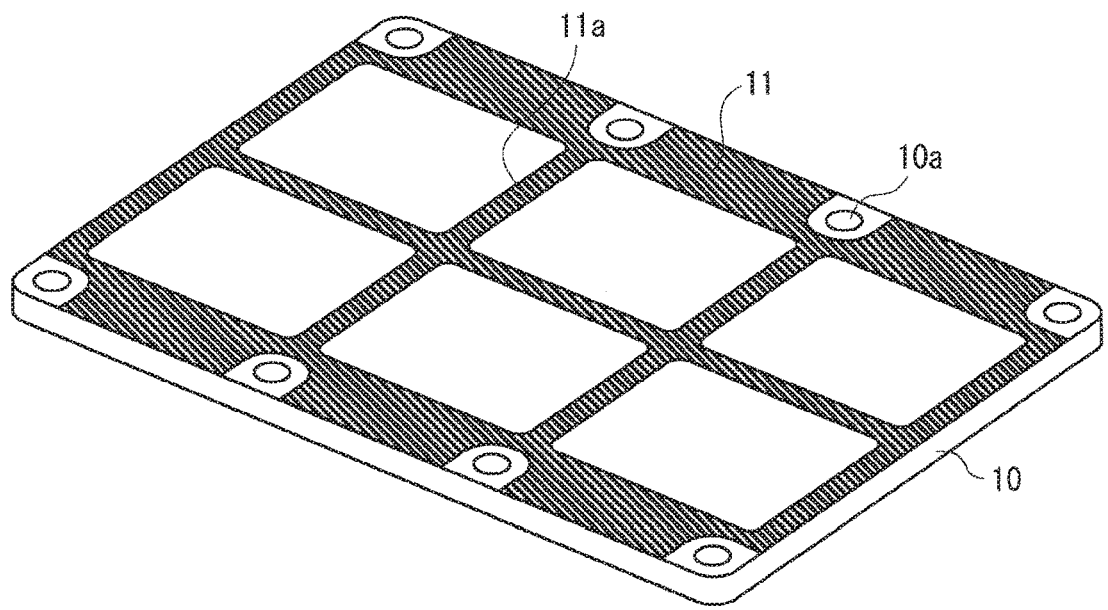
FIG. 1 is a diagram of a radiation plate structure according to a first embodiment.

FIG. 1 is a diagram of a radiation plate structure according to a first embodiment. The radiation plate structure includes a radiation plate 10 and a solder resist 11 disposed on a main surface of the radiation plate 10. The radiation plate 10 is made of a material, such as copper (Cu), aluminum (Al), and metal matrix composites (MMCs). The radiation plate 10 has through-holes 10a through which the radiation plate 10 is screwed to a component (not shown) such as a heatsink. The solder resist 11 is formed of a pattern having at least one opening 11a (herein, six openings). In the first embodiment, the solder resist 11 is made of polyimide (PI) or polyamide (PA).

Figure 2:
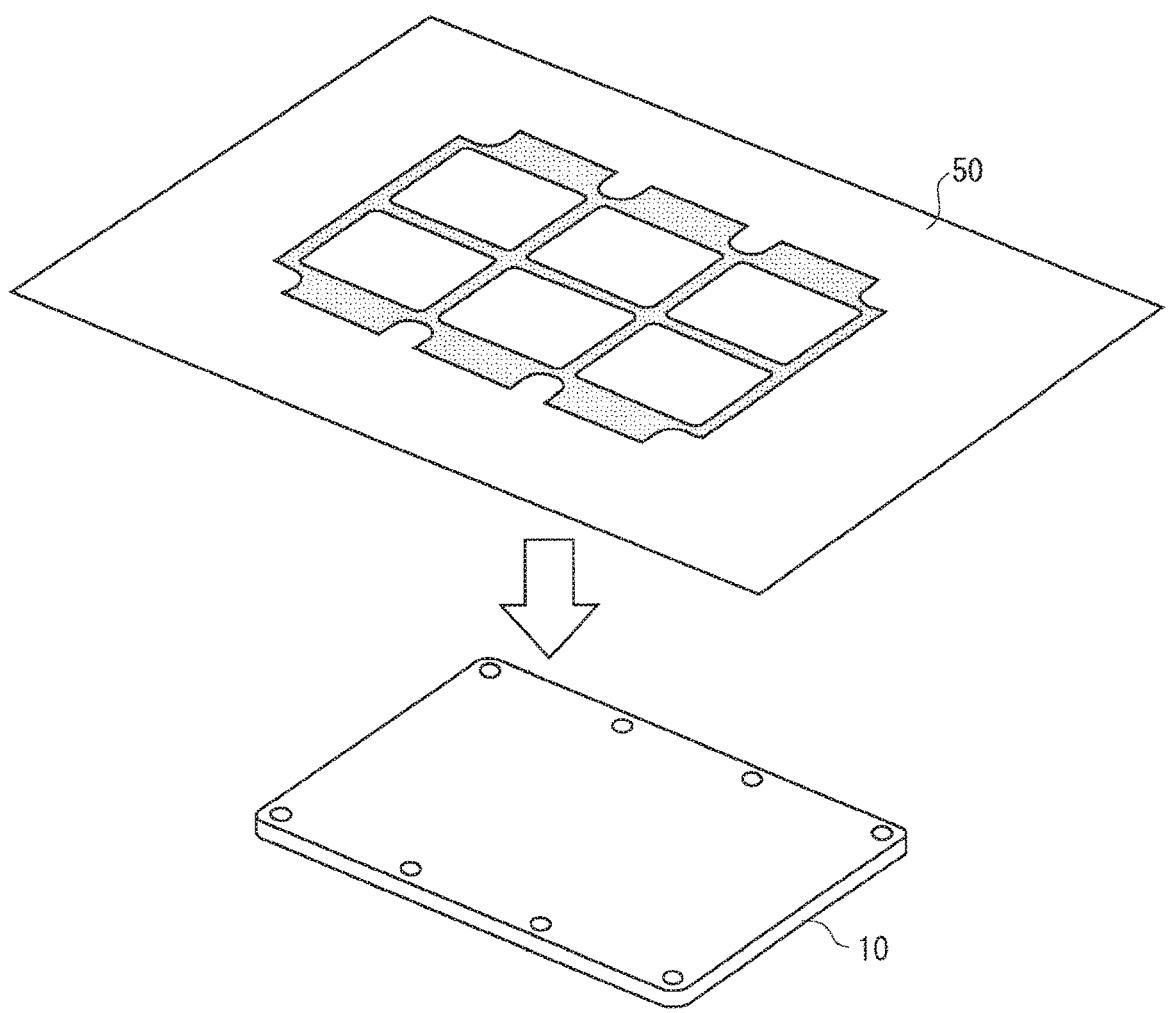
FIG. 2 is a diagram illustrating a method for manufacturing the radiation plate structure according to the first embodiment.
Figure 3:
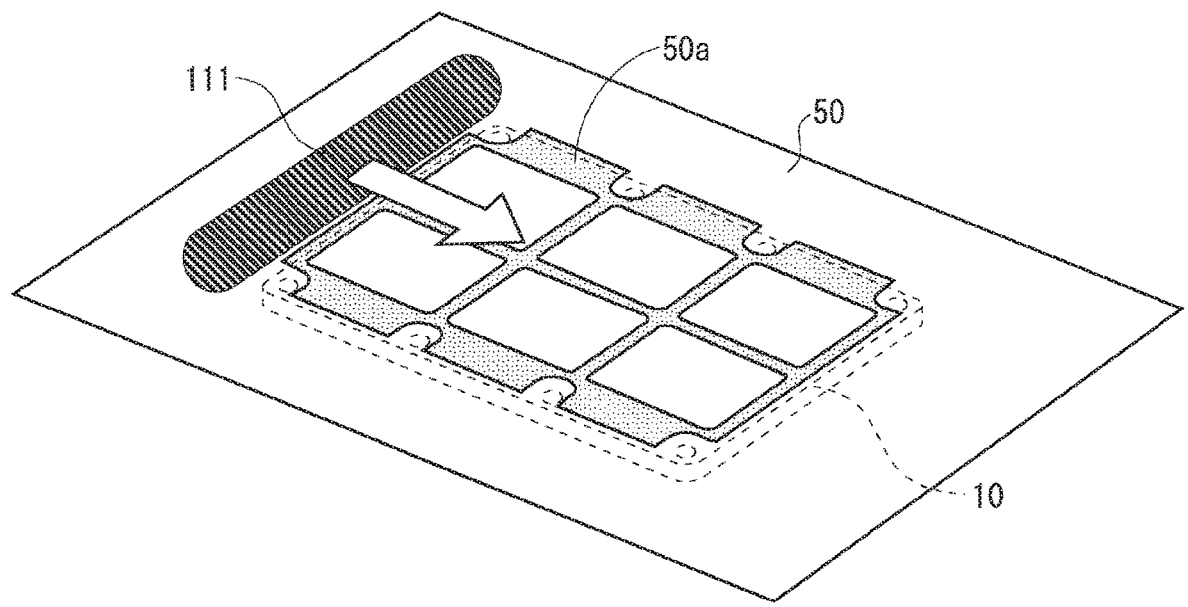
FIG. 3 is a diagram illustrating the method for manufacturing the radiation plate structure according to the first embodiment.

The following describes a method for manufacturing the radiation plate structure according to the first embodiment. The first step is preparing the radiation plate 10, and as illustrated in FIG. 2, placing a screen-printing mask 50 having meshed holes formed to match the shape of the pattern of the solder resist 11 onto the radiation plate 10. The following step is applying solder resist liquid 111 (PI liquid or PA liquid) onto the screen-printing mask 50, and spreading the solder resist liquid 111 across the screen-printing mask 50 with a squeegee. Accordingly, the solder resist liquid 111 is printed on a surface of the radiation plate 10 to form the pattern of the solder resist 11. After that, the solder resist liquid 111 undergoes ultraviolet (UV) irradiation and heating for cure. This completes the solder resist 11.

PA and PI have a better thermal resistance and better insulation properties than a conventional solder resist material, such as a phenolic resin and an epoxy resin. Moreover, PA and PI have a higher viscosity (thixotropy) than the phenolic resin or the epoxy resin. This enables the solder resist 11 to be thick to a degree ranging from 10 to 30 μm.

Figure 4:
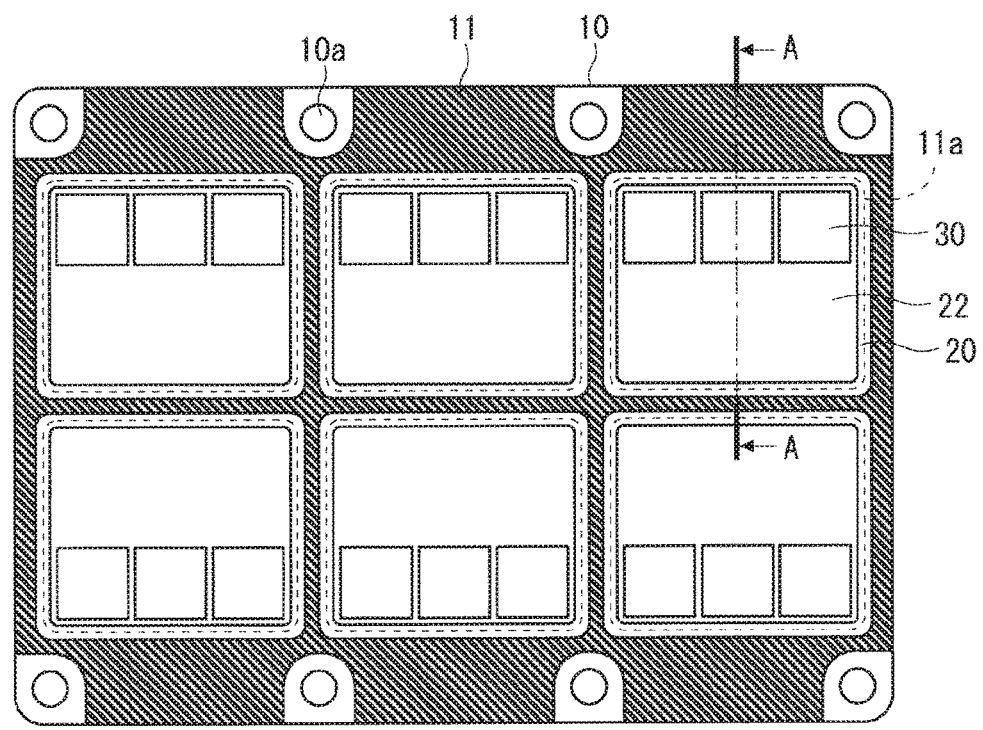
FIG. 4 is a top view of the semiconductor device according to the first embodiment.

FIGS. 4 and 5 are diagrams of a configuration of a semiconductor device including the radiation plate structure according to the first embodiment. FIG. 4 is a top view of the semiconductor device. FIG. 5 is a cross-sectional view taken along line A-A in FIG. 4.

As illustrated in FIG. 4, the semiconductor device includes an insulating substrate 20 (e.g., ceramic substrate) disposed in a position corresponding to the opening 11a of the solder resist 11 on the radiation plate 10, the insulating substrate 20 being provided with a semiconductor element 30. Although six insulating substrates 20 are disposed on one radiation plate 10 herein, any number of insulating substrates 20 is provided. The number of openings 11a to be disposed in the solder resist 11 is set depending on the number of insulating substrates 20 to be mounted.

As illustrated in FIG. 5, the insulating substrate 20 has an upper surface provided with a circuit pattern 21 and a lower surface provided with a circuit pattern 22, the circuit patterns 21 and 22 being made of a conductive material. The semiconductor element 30 is joined to the circuit pattern 21 on the upper surface of the insulating substrate 20 with solder 41. Further, the circuit pattern 22 on the lower surface of the insulating substrate 20 is joined on the upper surface of the radiation plate 10 with solder 42. The solder 41, with which the radiation plate 10 is joined to the circuit pattern 22 of the insulating substrate 20, is disposed within the opening 11a of the solder resist 11.

The semiconductor device is assembled through, for instance, the following process steps. The first step is placing a sheet of the solder 41 onto the circuit pattern 21 of the insulating substrate 20, and mounting the semiconductor element 30 onto the sheet of the solder 41. The next step is reflowing the solder 41 for melt to thus join the semiconductor element 30 and the circuit pattern 21 together. The following step is placing a sheet of the solder 42 onto the radiation plate 10 including the solder resist 11, and mounting the insulating substrate 20 onto the sheet of the solder 42. At this time, the circuit pattern 22 of the insulating substrate 20 is made to face the radiation plate 10. The following step is reflowing the solder 42 for melt to thus join the radiation plate 10 and the circuit pattern 22 together. At this time, the solder 42 as melted is held within the opening 11a by the solder resist 11 of the radiation plate 10. This prevents the insulating substrate 20 from shifting. It is noted that either step may be performed first, the joining of the semiconductor element 30 and the circuit pattern 21 or the joining of the radiation plate 10 and the circuit pattern 22.

The semiconductor device illustrated in FIGS. 4 and 5 is contained in a case including an external connection terminal, which is not shown. Further, the case is filled with a sealant that is an insulating gel resin.

In the present embodiment, the solder resist 11 of the radiation plate 10 is made of PA or PI, which has a high thermal resistance. Consequently, the solder resist 11 is prevented from being removed from the radiation plate 10 when the solder 42 undergoes a reflowing step for melt. This enables the solder 42 to be held in a prescribed position, thereby preventing the insulating substrate 20 from shifting. Moreover, the semiconductor device is more reliable in a high temperature environment.

Further, PA or PI has high insulation properties and a high viscosity. This enables the solder resist 11 to be thick. Consequently, the solder resist 11 has high insulation properties. This enables the semiconductor device to have a higher breakdown voltage, thereby contributing to an improvement in reliability of the semiconductor device.

Here, as illustrated in FIG. 5, the opening 11a of the solder resist 11a is preferably of a size smaller than the insulating substrate 20. Moreover, the ends of the insulating substrate 20 preferably extend to be positioned above the solder resist 11. That is, the solder resist 11 is preferably interposed between the ends of the insulating substrate 20 and the radiation plate 10. For instance, the insulating gel resin, which seals the semiconductor device, can contain air bubbles in a high temperature environment. When the air bubbles reach the ends of the insulating substrate 20, electricity is likely discharged between the ends of the insulating substrate 20 and the radiation plate 10. Interposing the solder resist 11 having high insulation properties between the ends of insulating substrate 20 and the radiation plate 10 prevents the electric discharge.

In addition, the thick solder resist 11 improves its original function of holding the solder 42 in a prescribed position. Further, "solder balls" or solder particles can be produced and splattered in the reflowing step. The semiconductor device is unfortunately difficult to be assembled in some locations where the solder balls adhere. The thick solder resist 11 also prevents the solder balls from splattering outside the opening 11a.

Second Embodiment

In the first embodiment, the solder resist 11 on the radiation plate 10 is made of PI or PA. In a second embodiment, a solder resist 11 is made of polypropylene (PP) or polyphenylene sulfide (PPS). It is noted that a radiation plate structure including a radiation plate 10 and the solder resist 11 is configured in a manner similar to the radiation plate structure in the first embodiment (FIG. 1).

Figure 7:
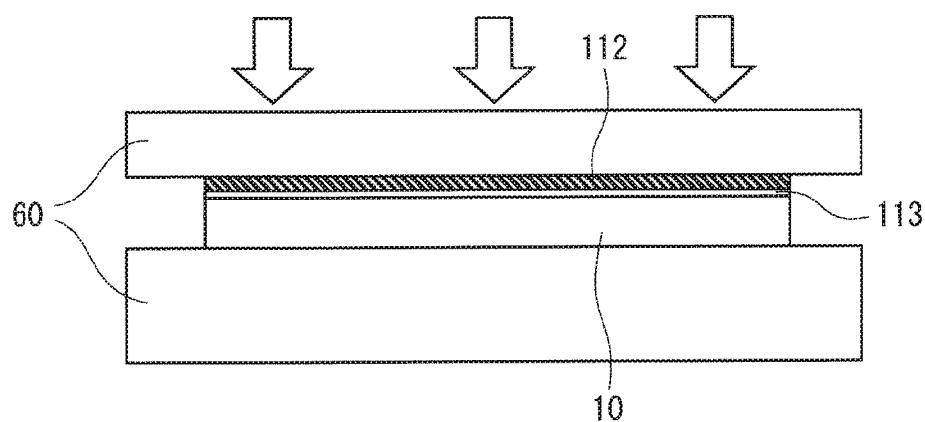
FIG. 7 is a diagram illustrating the method for manufacturing the radiation plate structure according to the second embodiment.

The following describes a method for manufacturing the radiation plate structure according to the second embodiment. The first step is, as illustrated in FIG. 6, preparing the radiation plate 10 and a solder resist sheet 112 (an engineering plastic sheet or film made of PP or PPS) that is processed to form a pattern of the solder resist 11. The following step is, as illustrated in FIG. 7, placing the solder resist sheet 112 onto the radiation plate 10 through an adhesive 113, and heat-pressing the solder resist sheet 112 with a pressing apparatus 60 to attach the solder resist sheet 112 to the radiation plate 10. This completes the radiation plate 10 including the solder resist 11. In some embodiments, the solder resist sheet 112 is welded or fused to the radiation plate 10.

PP or PPS has a better thermal resistance and better insulation properties than a conventional solder resist material, such as a phenolic resin and an epoxy resin. This enables the solder resist 11 to have a high thermal resistance and high insulation properties, thereby contributing to an improvement in reliability of a semiconductor device, in a manner similar to the first embodiment.

Further, for the formation of the solder resist 11 through the aforementioned process steps, the thickness of the solder resist sheet 11 is adjustable in accordance with the thickness of the solder resist sheet 112 to be prepared. This enables the solder resist 11 to have a greater thickness (10 μm or more) than a conventional solder resist, and further enables to have a greater thickness than the solder resist 11 in the first embodiment. Consequently, the semiconductor device according to the present embodiment has more improved insulation properties than the semiconductor device according to the first embodiment.

Figure 8:
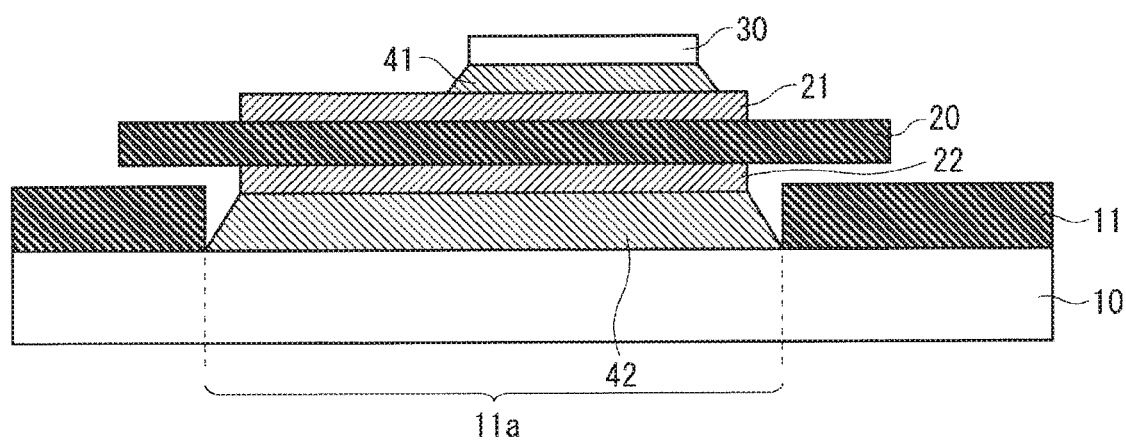
FIG. 8 is a cross-sectional view of the semiconductor device according to the second embodiment.

In particular, the solder resist 11 is preferably thicker than solder 42 when the semiconductor device is assembled, as illustrated in FIG. 8. In this case, the insulation properties are improved. In addition, solder balls are prevented from splattering outside an opening 11a of the solder resist 11 without fail. Nevertheless, the solder resist 11 needs to have a thickness smaller than the sum of the thickness of the solder 42 and the thickness of a circuit pattern 22 in at least an overlap between the solder resist 11 and the insulating substrate 20, so as not to interfere with the insulating substrate 20.

Third Embodiment

In a third embodiment, a solder resist 11 on a radiation plate 10 is made of a resin containing particulate ceramic. The present embodiment is implementable by forming a solder resist sheet 112 with a resin containing particulate ceramic. Ceramic, which has good insulation properties and a good thermal resistance, enables the solder resist 11 to have improved insulation properties and an improved thermal resistance when compared to the solder resist 11 in the second embodiment.

Examples of the ceramic in the present embodiment include aluminum nitride (AlN), silicon nitride ($Si_3N_4$), and aluminum oxide ($Al_2O_3$). Further, the resin containing the particulate ceramic is preferably made of PP or PPS as already described in the second embodiment. Still further, a conventional phenolic resin or epoxy resin, when containing the particulate ceramic, improves the insulation properties and thermal resistance of the solder resist 11.

In addition to the aforementioned effects, adjusting the particulate ceramic achieves a wide range of design, thereby achieving a greater likelihood of design. For instance, adjusting the particulate ceramic to regulate the thermal expansion coefficient of the resin expectantly prevents a stress between the solder resist 11 and the radiation plate 10.

Fourth Embodiment

The solder resist 11 may be made of any material, other than resin, that has high insulation properties and a high thermal resistance, and exerts an original function of the solder resist 11. In a fourth embodiment, a solder resist 11 is formed of a high-melting-point insulator (its melting point is preferably 400 degrees or more) made of, for instance, glass. The present embodiment is implementable by forming a solder resist sheet 112 that includes a high-melting-point insulator in the second embodiment. The high-melting-point insulator is difficult to be fused or welded to a radiation plate 10. Accordingly, the solder resist sheet 112 is joined to the radiation plate 10 with an adhesive 113. A material such as glass having higher insulation properties and a higher thermal resistance than PP and PPS enables the solder resist 11 to have dramatically improved insulation properties and a dramatically improved thermal resistance.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

Explanation of Reference Signs 10 radiation plate, 10a through-hole, 11 solder resist, 11a opening, 111 solder resist liquid, 112 solder resist sheet, 113 adhesive, 20 insulating substrate, 21 circuit pattern, 22 circuit pattern, 30 semiconductor element, 41, 42 solder, 50 screen-printing mask, 50a meshed pattern, and 60 pressing apparatus.

The invention claimed is:

1. A semiconductor device comprising:
   a radiation plate including a plurality of radiation plate through-holes;
   a solder resist disposed on a main surface of the radiation plate and comprising at least one opening;
   an insulating substrate comprising a circuit pattern soldered to the radiation plate within the opening of the solder resist; and
   a semiconductor element disposed on the insulating substrate, wherein
   ends of the insulating substrate extend to be positioned above the solder resist;
   the solder resist has a thickness greater than a thickness of solder with which the radiation plate is joined to the insulating substrate, the thickness of the solder resist being smaller than a sum of the thickness of the solder and a thickness of the circuit pattern in at least an overlap between the solder resist and the insulating substrate, and
   the solder resist partially surrounds each of the radiation plate through-holes by extending to an edge of the radiation plate.

2. The semiconductor device according to claim 1, wherein the solder resist comprises polypropylene (PP) or polyphenylene sulfide (PPS).

3. The semiconductor device according to claim 1, wherein the solder resist comprises a resin comprising particulate ceramic.

4. The semiconductor device according to claim 3, wherein the ceramic comprises at least one of aluminum nitride (AlN), silicon nitride ($Si_3N_4$), and aluminum oxide ($Al_2O_3$).

5. The semiconductor device according to claim 3, wherein the resin comprises polypropylene (PP) or polyphenylene sulfide (PPS).

6. The semiconductor device according to claim 1, wherein the solder resist comprises a high-melting-point insulator having a melting point of 400° C. or more.

7. The semiconductor device according to claim 6, wherein the high-melting-point insulator comprises glass.

* * * * *